(12) United States Patent
Miyamoto

(10) Patent No.: US 7,417,438 B2
(45) Date of Patent: Aug. 26, 2008

(54) BATTERY VOLTAGE MEASUREMENT APPARATUS

(75) Inventor: Manabu Miyamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 23 days.

(21) Appl. No.: 11/387,926

(22) Filed: Mar. 24, 2006

(65) Prior Publication Data

US 2006/0220461 A1  Oct. 5, 2006

(30) Foreign Application Priority Data

Mar. 30, 2005  (JP) .............................. 2005-098596

(51) Int. Cl.
*G01R 31/08* (2006.01)
*G10F 1/02* (2006.01)

(52) U.S. Cl. ........................ 324/522; 324/520; 324/433; 320/121

(58) Field of Classification Search ................. 324/520, 324/522, 433; 320/119–121
See application file for complete search history.

(56) References Cited

U.S. PATENT DOCUMENTS 3,487,295 A * 12/1969 Berkowitz et al. ............ 324/434

FOREIGN PATENT DOCUMENTS

JP  09219935 A * 8/1997
JP  2001-116776    4/2001

* cited by examiner

*Primary Examiner*—Vincent Q Nguyen
(74) *Attorney, Agent, or Firm*—Young & Thompson

(57) ABSTRACT

A voltage measurement circuit includes a plurality of voltage input terminals that are supplied with voltage outputted by secondary batteries via voltage measurement lines, a plurality of voltage sensors connected between each of the plurality of voltage input terminals; and a plurality of constant current sources that are connected between the plurality of the voltage input terminals and supply the plurality of voltage input terminals being connected with specified voltage when the voltage measurement line is disconnected.

17 Claims, 4 Drawing Sheets

BATTERY VOLTAGE MEASUREMENT APPARATUS

BACKGROUND OF THE INVENTION

1. Field of the Invention

The present invention relates to a battery voltage measurement apparatus for detecting battery voltage of power supply unit including a plurality of secondary batteries connected in series, and more particularly to a battery voltage measurement apparatus for immediately detecting a disconnection of a signal line when a signal line for measuring voltage is disconnected.

2. Description of Related Art

A hybrid vehicle having a motor along with an engine as a driving source for running a vehicle has been widely known. One kind of control (mode) for the hybrid vehicles includes a parallel hybrid vehicle whose motor helps boost engine power. This parallel hybrid vehicle attempts to satisfy a driver's demand by performing various controls while securing remaining amount of a battery. The controls are for example assisting engine power using a motor at acceleration and charging a battery and such. The battery is usually comprised of a plurality of battery cells connected in series because high voltage is required.

A plurality of voltage sensors are used for detecting a voltage of this battery. A plurality of battery cells connected in series to constitute a battery is divided into an appropriate number of cells and modularized. The plurality of voltage sensors are provided to each module and connected with each module by voltage measurement lines.

When a disconnection occurred on a voltage measurement line, it is important to immediately detect the disconnection and take a failsafe action. Accordingly, the technique disclosed in Japanese Unexamined Patent Publication No. 2001-116776 describes that in general, each module is connected with a resistor for detecting measurement line disconnection in addition to a voltage sensor comprised of semiconductor integrated circuits and filter portion. FIG. 4 is a view showing a voltage measurement apparatus described in this technique. In the voltage measurement apparatus illustrated in FIG. 4, resistors for detecting disconnection 2-1 to 2-n are placed. Resistance values of resistors for detecting disconnection 2-1 to 2-n are alternately placed in each module with different values. In the apparatus illustrated in FIG. 4, if a voltage measurement line Q is disconnected for example, a voltage value detected by voltage sensors 4-1 and 4-2 will be the value corresponding to a resistance ratio of the resistors for detecting measurement line disconnection 2-1 and 2-2 respectively. This allows the voltage sensors 4-1 and 4-2 to detect a voltage not normally detected, consequently the disconnection of the voltage measurement line can be immediately detected.

However it has now been discovered that a voltage measurement apparatus of a conventional technique requires that resistances for detecting measurement line disconnection 2-1 to 2-n to be inserted in parallel to each module, where the resistances need to be several MΩ so as to suppress current in standby mode (dark current). Nevertheless a detectable resistance value is limited, and thus it is difficult to reduce current below a resistance value being limited.

SUMMARY OF THE INVENTION

According to an aspect of the present invention, there is provided a voltage measurement apparatus that includes a plurality of voltage input terminals to which voltage that is outputted by secondary batteries via voltage measurement lines is applied, a plurality of voltage sensors connected between each voltage input terminals, a plurality of constant current sources that supply the voltage input terminals being connected with specified current when the voltage measurement lines are disconnected.

This structure disables current to pass from a constant current source to a voltage input terminal when a voltage measurement line is disconnected, thus a voltage sensor is to detect an abnormal voltage.

By setting constant current sources to minimum current necessary to detect a disconnection, it is possible to eliminate redundant current and suppress current consumption of a voltage measurement apparatus.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
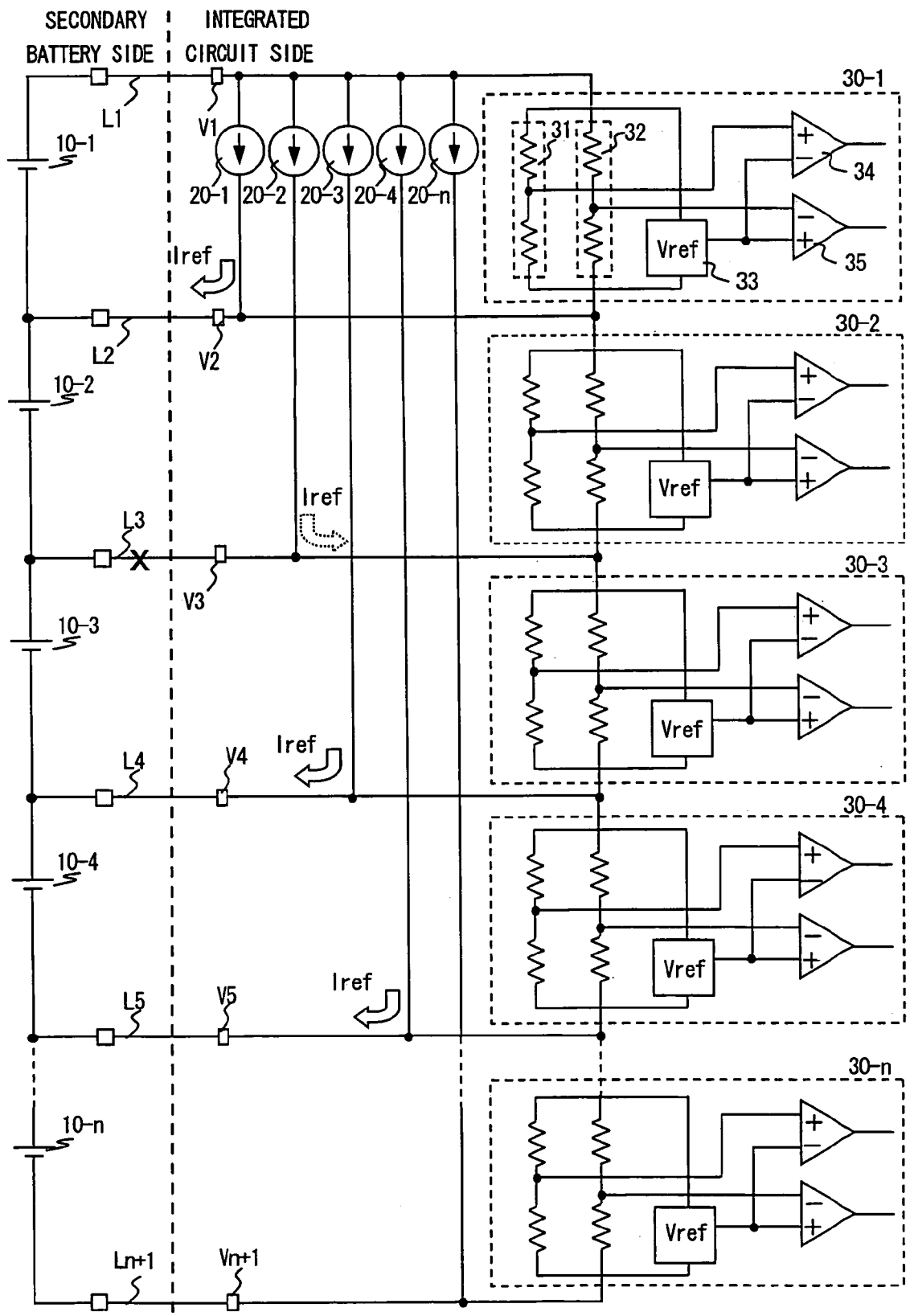
FIG. 1 is a circuit view showing a voltage measurement apparatus according to a first embodiment of the present invention.

An embodiment of the present invention is described hereinafter with reference to the drawings. FIG. 1 is a schematic view explaining a voltage measurement apparatus according to a first embodiment of the invention. As shown in FIG. 1, a plurality of secondary batteries 10-1 to 10-n are connected in series in the first embodiment. In this example, although 10-1 to 10-n are represented as single batteries, they may be a plurality of batteries connected in series and modularized. Both ends of each secondary battery are connected to voltage input terminals V1 to Vn+1 via voltage measurement lines L1 to Ln+1. The voltage measurement apparatus of the first embodiment includes constant current sources 20-1 to 20-n and voltage sensors 30-1 to 30-n for the number of secondary batteries to be measured.

In the first embodiment, the constant current source 20-1 passes a constant current Iref from the voltage input terminal V1 that is connected to a positive electrode of the secondary battery 10-1 to the voltage input terminal V2 that is connected to a negative electrode of the secondary battery 10-1. The constant current source 20-2 passes a constant current Iref from the voltage input terminal V1 that is connected to the positive electrode of the secondary battery 10-1 to the voltage input terminal V3 that is connected to a negative electrode of the secondary battery 10-2. Other constant current sources are sequentially connected likewise. The constant current source 20-$n$ passes a constant current from the voltage input terminal V1 that is connected to the positive electrode of the secondary battery 10-1 to the voltage input terminal Vn+1 that is connected to a negative electrode of the secondary battery 10-$n$. The constant current sources 20-1 to 20-$n$ passes current to the voltage input terminals. The voltage input terminals are supplied with current via the constant current sources 20-1 to 20-$n$.

Voltage sensors 30-1 to 30-$n$ are connected between each voltage input terminals. More specifically, the voltage sensor 30-1 is connected between the voltage input terminals V1 and V2, while the voltage sensor 30-2 is connected between the voltage input terminals V2 and V3. Each voltage sensor measures voltage of a corresponding secondary battery connected between voltage input terminals.

As shown in FIG. 1, the voltage sensor of the first embodiment includes a voltage dividing resistor for detecting overvoltage 31, a voltage dividing resistor for detecting undervoltage 32, a reference voltage generating circuit 33, a comparator for detecting overvoltage 34 and a comparator for detecting undervoltage 35. A structure of the voltage sensors 30-1 to 30-$n$ is described hereinafter with reference to the voltage sensor between the voltage input terminals V1 and V2 illustrated in FIG. 1 as an example.

The voltage dividing resistor for detecting overvoltage 31, the voltage dividing resistor for detecting undervoltage 32 are connected between the voltage input terminals V1 and V2. The voltage dividing resistor for detecting overvoltage 31 and the voltage dividing resistor for detecting undervoltage 32 are provided in parallel to each other. A voltage dividing point of the voltage dividing resistor for detecting overvoltage 31 is connected to a noninverting input terminal of a comparator for detecting overvoltage 34. A voltage dividing point of the voltage dividing resistor for detecting undervoltage is connected to a inverting input terminal of the comparator for detecting undervoltage 35. A voltage outputted by the reference voltage generation part 33 is connected to a inverting input terminal of the comparator for detecting overvoltage 34 and a noninverting input terminal of the comparator for detecting undervoltage 35.

Normal operation of the voltage measurement apparatus with the above configuration is described hereinafter. If there is no disconnection on the voltage measurement lines L1 to Ln+1, voltage outputted by secondary batteries are supplied to each voltage input terminal. The voltage sensors 30-1 to 30-$n$ are supplied with voltages outputted by each of the secondary batteries. The voltage sensors produce a result of a measurement on the voltage outputted by the secondary batteries.

In the voltage sensors, voltage at voltage dividing points for the voltage divider resistors for detecting overvoltage is compared against reference voltage Vref. Assume that the voltage dividing resistor for detecting overvoltage 31 has a resistance ratio of low voltage side: high voltage side=1:3. Also assume that 1V is specified as a reference voltage Vref. If the voltage of the voltage dividing resistor for detecting overvoltage is higher than the reference voltage Vref for example, an overvoltage comparator outputs overvoltage detection signal (for example H level signal). Since in this example the resistance ratio is assumed to be 1:3, supplying voltage of 4V or more as a battery voltage causes the voltage at the voltage dividing point to exceed 1V, which is an overvoltage condition.

Similarly under an assumption that a resistance ratio of voltage dividing resistor for detecting undervoltage to be low voltage side: high voltage side=1:1 and Vref to be 1V, if battery voltage becomes 2V or less, a voltage at a voltage dividing point for detecting undervoltage will be less than 1V. The comparators for detecting undervoltage compare voltage at voltage dividing points of resistances for detecting undervoltage against a reference voltage. If a voltage at the voltage dividing point is lower than a reference voltage, an undervoltage detection signal (for example H level) is outputted. Although the explanation foregoing used simple values for the ease of explanation, it shall not always apply to any case. By properly setting a voltage division ratio of a voltage dividing resistor for detecting overvoltage and undervoltage against this reference voltage Vref, it is possible to detect overvoltage and undervoltage.

Current generated by constant current sources 20-1 to 20-$n$ in a normal operation flows to negative electrodes of secondary batteries via voltage input terminals V2 to Vn+1 and voltage measurement lines L2 to Ln+1 (See the arrow in FIG. 1). It indicates that in this embodiment, if there is no disconnection on the voltage measurement lines L1 to Ln+1, the current Iref, which is always generated by constant current source, flows in each voltage input terminal.

In case of a disconnection occurred in the voltage measurement line L3, all currents flowing from V1 to V3 by way of the constant current source 20-2 are passed to voltage sensors 30-2 and 30-3 (See dotted arrow in FIG. 1). In consequence a voltage of a node between the voltage sensor 30-2 and 30-3 increases, and the voltage sensors detects a value not normally detected. Specifically the voltage sensor 30-2 detects an undervoltage while the voltage sensor 30-3 detects an overvoltage. By the voltage sensor 30-2 and 30-3 outputting a signal to indicate abnormal voltage, a disconnection of the voltage measurement line L3 can be detected. In this embodiment, a voltage dividing resistors for measuring overvoltage and undervoltage inside voltage sensors are used as a part of the voltage sensors in a normal operation, and not external devices for detecting a disconnection, as in a conventional technique.

According to this embodiment, using constant current sources allows to detect a disconnection without having a external resistance for detecting disconnection as in a conventional technique. This will reduce the number of parts used in a voltage measurement apparatus, and thus downsizing the voltage measurement apparatus.

Moreover in a conventional voltage measurement apparatus, resistors for detecting disconnection having a large resistance are used so as to eliminate current flowing in a voltage measurement apparatus in standby mode (dark current). However obtainable resistance value is limited and so it is difficult to adequately reduce dark current. On the other hand, this invention adopts constant current sources instead of resistors for detecting disconnection, thereby enabling the constant current sources to determine dark current. By using constant current source, current can be set to a level of several µA, therefore current consumption in standby time can be significantly reduced.

Second Embodiment

Figure 2:
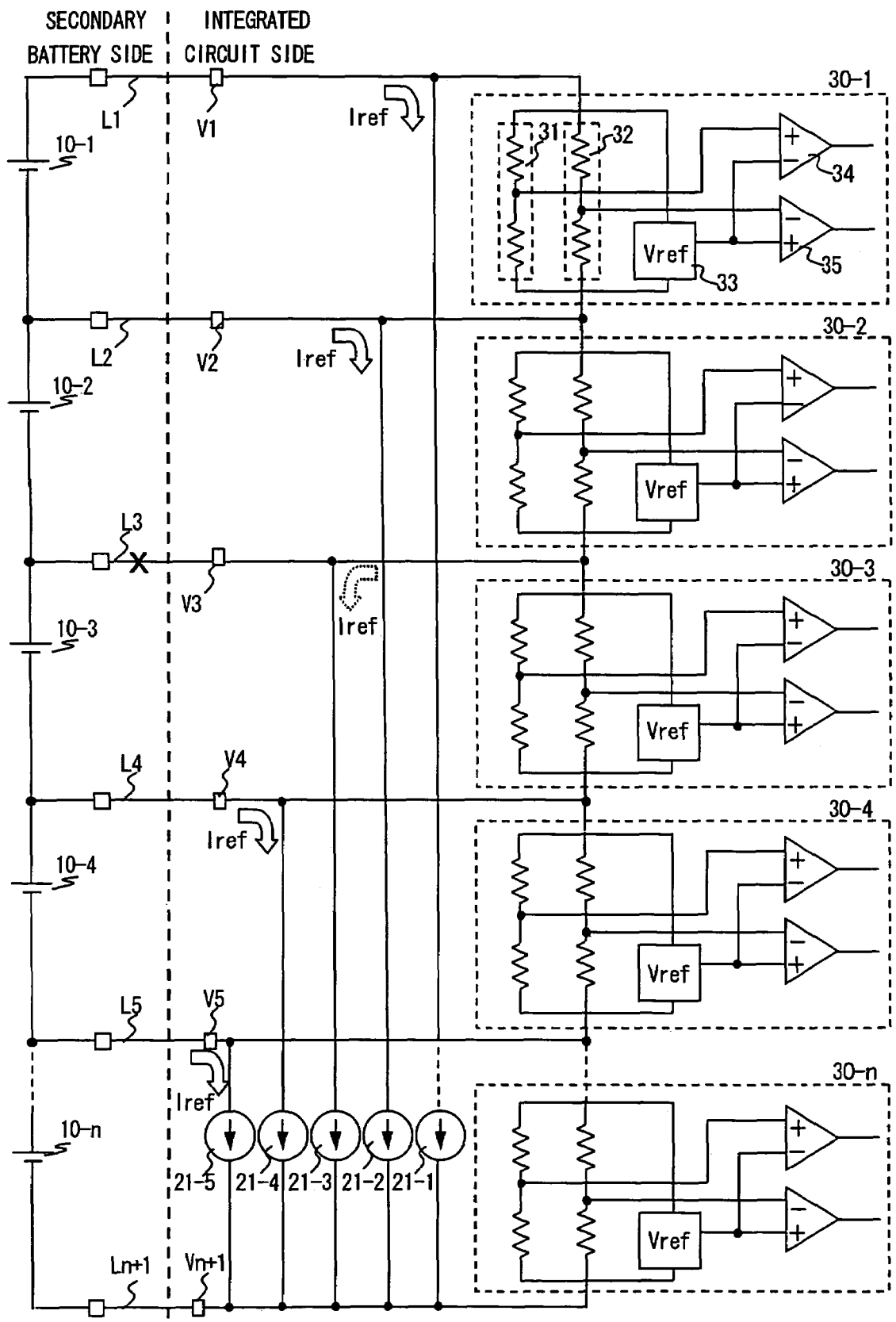
FIG. 2 is a circuit view showing a voltage measurement apparatus according to a second embodiment of the present invention.

FIG. 2 is a circuit diagram showing a voltage measurement apparatus according to a second embodiment of the present invention. In FIG. 2, structures identical to those in FIG. 1 are denoted by reference numerals identical to those therein with detailed description omitted. The method of connecting constant current sources differs in a voltage measurement apparatus of the second embodiment from that of the first embodiment. A constant current source 21-1 passes a current constant Iref from a voltage input terminal V1 to Vn+1. A constant current source 21-2 passes a current constant Iref from a voltage input terminal V2 to Vn+1. As for the rest, a constant current source is connected from V3 to Vn+1, V4 to Vn+1 in sequence, and a constant current source 21-n passes a current constant Iref from a voltage input terminal Vn to Vn+1.

The constant current sources in the voltage measurement apparatus configured as described are supplied with current via voltage input terminals from secondary batteries in a normal operation. That is, current passed by constant current sources always run in the voltage input terminals unless no voltage measurement lines are disconnected. If a disconnection occurred in a voltage measurement line L3, a current Iref flowing from the voltage input terminal V3 to Vn+1 is not supplied by the secondary battery 10-3, but supplied only by the side of voltage sensors 30-2 and 30-3. This will cause current between the voltage sensors 30-2 and 30-3 to be discharged, and the voltage sensor 30-2 detects overvoltage while 30-3 detects undervoltage. Based on these detection signals, a disconnection of the voltage measurement line L3 is detected.

According to this embodiment, using constant current sources allows to detect disconnection without using external resistances for detecting disconnection as in a conventional technique. This reduces the number of parts used in a voltage measurement apparatus, and thus downsizing the voltage measurement apparatus.

A voltage measurement apparatus of a conventional technique uses resistances for detecting disconnection having a large resistance in order to eliminate current flowing in a voltage measurement apparatus in standby time (dark current). However obtainable resistance value is limited and so it is difficult to adequately reduce dark current. On the other hand, this invention adopts constant current sources instead of resistances for detecting disconnection, thereby enabling the constant current sources to determine dark current as well as significantly reducing current consumption in standby time.

Third Embodiment

Figure 3:
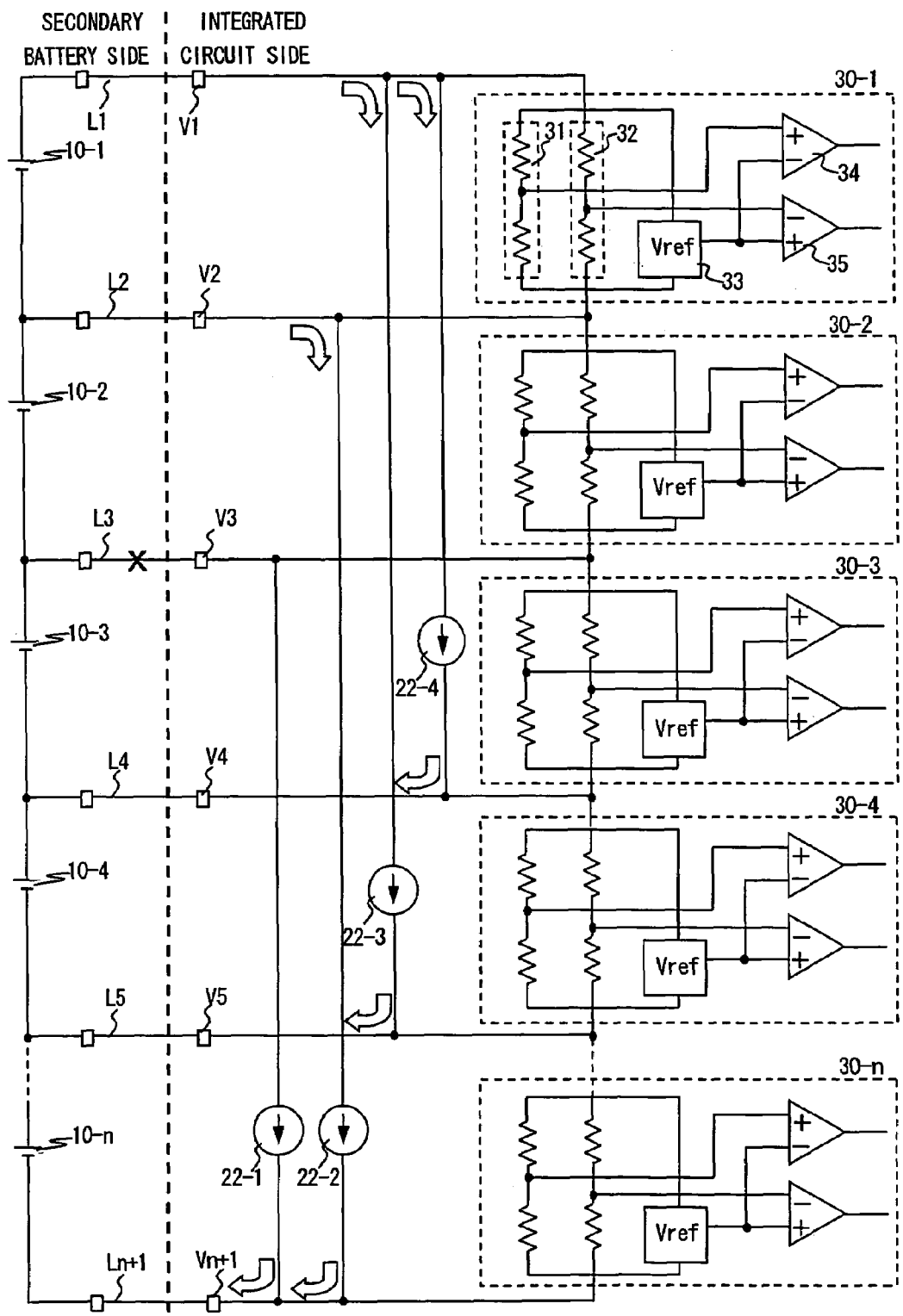
FIG. 3 is a circuit view showing a voltage measurement apparatus according to a third embodiment of the present invention.
Figure 4:
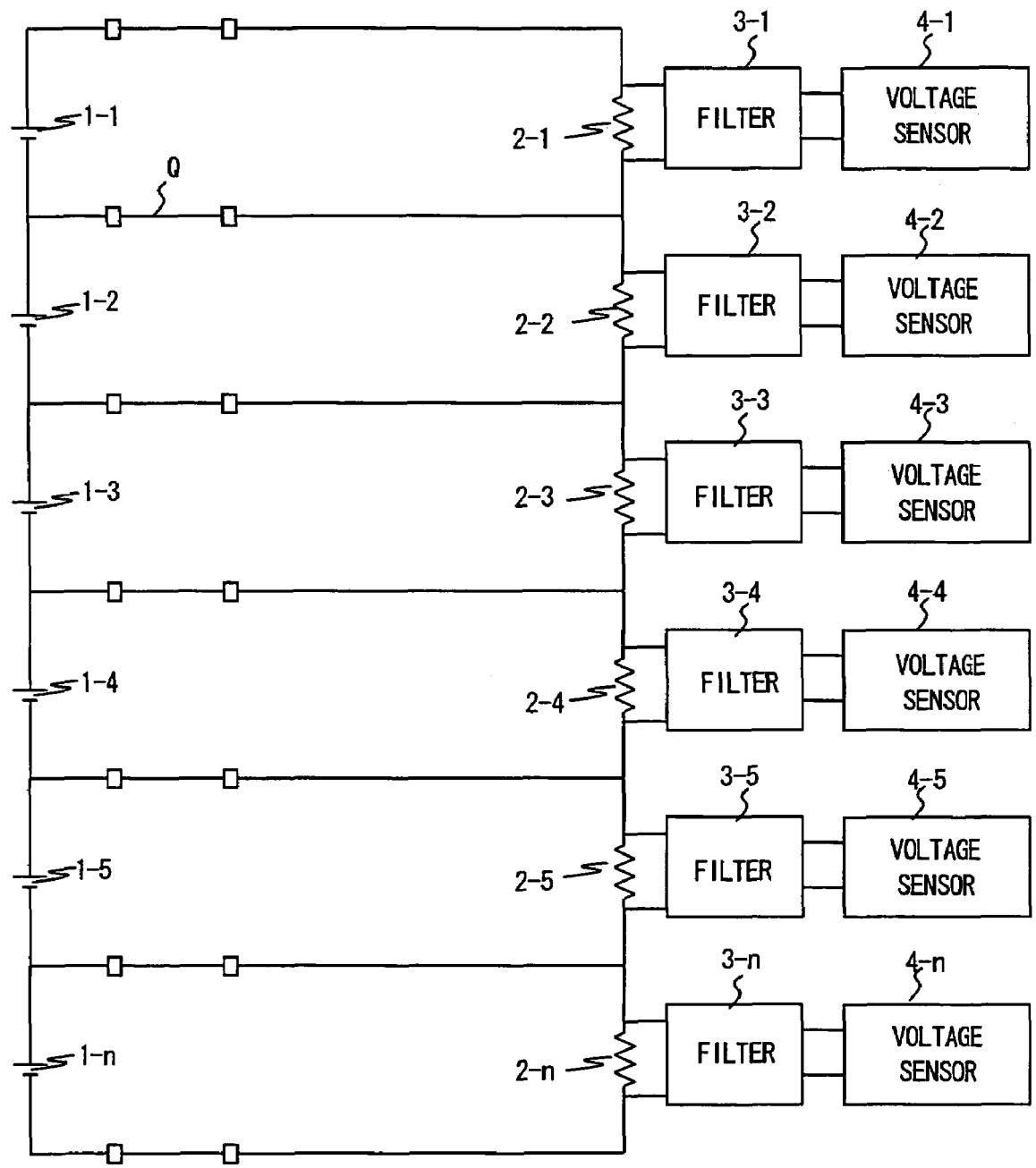
FIG. 4 is a circuit view showing a voltage measurement apparatus according to a conventional technique.

FIG. 3 is a circuit diagram showing a voltage measurement apparatus of a third embodiment of this invention. In FIG. 3, constituents identical to those in FIG. 1 are denoted by reference numerals identical to those therein with detailed description omitted. The method of connecting constant current sources differs in a voltage measurement apparatus of the third embodiment from that of the first embodiment.

In an example shown in FIG. 3, a constant current source 22-1 passes a constant current Iref from a voltage input terminal V3 to a voltage input terminal Vn+1. The constant current source 22-2 passes a constant currently source Iref from a voltage input terminal V2 to the voltage input terminal Vn+1. A constant current source 22-3 passes a constant current source Iref from a voltage input terminal V1 to a voltage input terminal V5. A constant current source 22-4 passes a constant current source Iref from the voltage input terminal V1 to a voltage input terminal V4.

Let us now focus on a constant current sources connected to each voltage input terminals. The voltage input terminal V2 and V3 are connected with suction-type constant current sources. The voltage input terminal V4 and V5 are connected with discharge-type constant current sources.

As described in the foregoing, each voltage input terminal is connected with either a suction-type constant current source or a discharge-type constant source. For example the voltage input terminal V3 is only connected with a suction-type constant current source 20-1 and no other discharge-type constant current source.

This configuration enables a current based on a constant current source to always flow in each voltage input terminals of the voltage measurement apparatus unless having a disconnection of a voltage measurement line.

With the connection described above, if a voltage measurement line is disconnected, a current that has lost its a current path to a negative electrode of a secondary battery (or current path from a positive electrode of a secondary battery) will definitely gain a current path to a voltage sensor (or current path from a voltage sensor). This enables the voltage sensor to detect an abnormal voltage.

For example a suction-type constant current source from the voltage input terminal V1 is connected to the voltage input terminal V3 and a discharge-type constant current source is connected from the voltage input terminal V3 to V5, provided the current values of the two current sources are the same, no current is to flow in the voltage input terminal V3 whether a voltage measurement line is disconnected or not. At this point if a voltage measurement line L3 is disconnected, a constant current from a node V1 is flown into a constant current source running from a node V3 to V5, thus the disconnection of the voltage measurement line L3 may not be detected. For this reason in this embodiment, one voltage input terminal is connected with either of a suction-type constant current source or a discharge-type constant current source.

A selection of "suction-type" or "discharge-type" current source to be connected to voltage input terminals determines whether each voltage input terminal to have a configuration of a current flowing into a voltage sensor or current being discharged from a voltage sensor when a there is a disconnection. This configuration helps improve a flexibility of a system.

Though a preferred embodiment of the present invention is described in detail in the foregoing, the present invention is not restricted to the above-mentioned embodiment but various changes may be made. For example in the first and second embodiment, although the constant current sources 20-n and 21-n are connected with the voltage input terminal Vn+1, the constant current sources need not to be connected in a case where a circuit operation generates an error when a voltage measurement line Ln+1 is disconnected, as long as the voltage input terminal Vn+1 is a ground potential to be a standard for the circuit.

For another example, the third embodiment explains that one voltage input terminal is to be connected to either a suction-type constant current source or a discharge-type constant current source. However this invention can be carried out by differentiating an amount of current flowing in one voltage input terminal from an amount of current flowing out from one voltage input terminal.

It is apparent that the present invention is not limited to the above embodiment and it may be modified and changed without departing from the scope and spirit of the invention.

What is claimed is:

1. A voltage measurement circuit comprising:
  a plurality of separate voltage input terminals that are each supplied with a respective voltage output from a respective different secondary battery;
  a plurality of separate voltage sensors that are each connected between a respective different pair of said voltage input terminals; and
  a plurality of separate constant current sources that are each connected between a respective different pair of said voltage input terminals.

2. The voltage measurement circuit of claim 1, wherein said plurality of separate constant current sources are connected to said plurality of separate voltage input terminals so that each of said plurality of separate voltage input terminals has either only current drawn therefrom or only discharged thereto by at least one of said plurality of separate constant current sources.

3. The voltage measurement circuit of claim 1, wherein each of said plurality of separate voltage sensors is connected to respective ones of said plurality of separate voltage input terminals in order to detect a current drawn from or discharged to a respective different one of said plurality of separate voltage input terminals by one of said plurality of separate constant current sources so that said plurality of separate voltage sensors are able to detect simultaneously.

4. The voltage measurement circuit according to claim 1, wherein each of the plurality of separate voltage input terminals is connected to at least one of the plurality of separate voltage sensors and at least one of the plurality of separate current sources.

5. The voltage measurement circuit according to claim 1, wherein each of the plurality of separate voltage sensors generates a detection signal indicative of disconnection between a corresponding one of the plurality of separate input terminals and a corresponding secondary battery.

6. A voltage measurement circuit comprising:
a plurality of current sources;
a plurality of voltage input terminals supplied with voltage outputted by secondary batteries, and connected to pass inflowing current from at least one of the plurality of current sources or outflowing current to at least one of the plurality of current sources;
a plurality of voltage sensors connected between adjacent terminals of the plurality of voltage input terminals, the plurality of voltage sensors including
a first voltage sensor; and
a second voltage sensor,
wherein the first voltage sensor and the second voltage sensor are each connected between a different pair of the voltage input terminals.

7. The voltage measurement circuit according to claim 6, wherein each terminal of the plurality of voltage input terminals is connected with input or output of at least one of the plurality of current sources.

8. The voltage measurement circuit according to claim 6, wherein the plurality of current sources are constant current sources.

9. The voltage measurement circuit according to claim 6, wherein the plurality of voltage input terminals include
a first voltage input terminal; and
a second voltage input terminal,
wherein the plurality of current source include
a first current source connected between the first voltage input terminal and the second voltage input terminal; and
wherein the first voltage terminal is a terminal for supplying a power supply voltage to the voltage measurement circuit, and the first current source discharges current toward the second voltage input terminal.

10. The voltage measurement circuit according to claim 6, wherein the plurality of voltage input terminals include
a first voltage input terminal, and
a second voltage input terminal,
wherein the plurality of current source include
a first current source connected between the first voltage input terminal and the second voltage input terminal, and
wherein the first voltage terminal is a terminal for supplying a ground voltage to the voltage measurement circuit, and the first current source sucks current from the second voltage input terminal.

11. The voltage measurement circuit according to claim 6, wherein the plurality of voltage input terminals include
a first voltage input terminal,
a second voltage input terminal and
a third voltage input terminal,
wherein the plurality of current source include
a first current source connected between the first voltage input terminal and the second voltage input terminal and
a second current source connected between the first voltage input terminal and the third voltage input terminal, and
wherein the first current source discharges current toward the second voltage input terminal from the first voltage input terminal and the second current source discharges current toward the third voltage input terminal from the first voltage input terminal.

12. The voltage measurement circuit according to claim 6, wherein the plurality of voltage input terminals include
a first voltage input terminal,
a second voltage input terminal and
a third voltage input terminal,
wherein the plurality of current source include
a first current source connected between the first voltage input terminal and the second voltage input terminal and
a second current source connected between the first voltage input terminal and the third voltage input terminal, and
wherein the first current source sucks current from the second voltage input terminal and the second current source sucks current from the third voltage input terminal.

13. The voltage measurement circuit according to claim 6, wherein the plurality of voltage input terminals include
a first voltage input terminal,
a second voltage input terminal,
a third voltage input terminal and
a fourth voltage input terminal,
wherein the plurality of current source include
a first current source connected between the first voltage input terminal and the second voltage input terminal and
a second current source connected between the third voltage input terminal and the fourth voltage input terminal, and
wherein the first current source discharges current toward the second voltage input terminal from the first voltage input terminal and the second current source discharges current toward the fourth voltage input terminal from the third voltage input terminal.

14. The voltage measurement circuit according to claim 13, wherein the first voltage input terminal,
a second voltage input terminal,
a third voltage input terminal and
a fourth voltage input terminal,
wherein the plurality of current source include
a first current source connected between the first voltage input terminal and the second voltage input terminal and
a second current source connected between the third voltage input terminal and the fourth voltage input terminal, and
wherein the first voltage terminal is a terminal for supplying a power supply voltage to the voltage measurement circuit, and the first current source discharges current toward the second voltage input terminal and the fourth voltage terminal is a terminal for supplying a ground voltage to the voltage measurement circuit, and the second current source sucks current from the third voltage input terminal.

15. The voltage measurement circuit according to claim 6, wherein each of the plurality of voltage input terminals is connected to at least one of the plurality of voltage sensors and at least one of the plurality of current sources.

16. The voltage measurement circuit according to claim 6, wherein each of the plurality of voltage sensors generates a detection signal indicative of disconnection between a corresponding one of the plurality of input terminals and a corresponding one of the secondary batteries.

17. A voltage measurement circuit comprising:
   a plurality of separate voltage input terminals that are each supplied with a respective voltage output from a respective different secondary battery;
   a plurality of separate voltage sensors that are each connected between a respective different pair of said voltage input terminals; and
   a plurality of separate constant current sources that are each connected between a respective different pair of said voltage input terminals so that each of said plurality of separate voltage input terminals has either only current drawn therefrom or only discharged thereto by at least one of said plurality of separate constant current sources,
   wherein each of said plurality of separate voltage sensors is connected to detect the current drawn from or discharged to a respective different one of said plurality of separate voltage input terminals so that said plurality of separate voltage sensors are able to detect simultaneously.

* * * * *